United States Patent
Haga et al.

(10) Patent No.: US 8,363,349 B2
(45) Date of Patent: Jan. 29, 2013

(54) RECORDING MEDIUM CONTROLLER AND METHOD THEREOF

(75) Inventors: Tatsuya Haga, Tokyo (JP); Hideaki Tanaka, Kanagawa (JP); Tatsuo Nitta, Tokyo (JP); Tadashi Hongawa, Tokyo (JP); Takahiro Shinbori, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/047,757

(22) Filed: Mar. 14, 2011

(65) Prior Publication Data
US 2011/0292538 A1 Dec. 1, 2011

(30) Foreign Application Priority Data
May 31, 2010 (JP) ................................ 2010-124898

(51) Int. Cl.
*G11B 5/596* (2006.01)
*G11B 5/09* (2006.01)
(52) U.S. Cl. .......... 360/78.04; 360/60; 360/48; 711/112
(58) Field of Classification Search .................. None
See application file for complete search history.

(56) References Cited

U.S. PATENT DOCUMENTS
2010/0232057 A1* 9/2010 Sanvido et al. ............ 360/78.04

FOREIGN PATENT DOCUMENTS
| JP | 2001-243021 | 9/2001 |
|---|---|---|
| JP | 2005-293774 | 10/2005 |
| JP | 2006-338731 | 12/2006 |
| WO | WO-99/45534 | 9/1999 |

OTHER PUBLICATIONS

Japanese Office Action mailed Jun. 14, 2011 in Japanese counterpart Patent Application No. 2010-124898 and translation.

* cited by examiner

*Primary Examiner* — Andrew L Sniezek
(74) *Attorney, Agent, or Firm* — Patterson & Sheridan, LLP (57) ABSTRACT

According to one embodiment, a recording medium controller includes a recording medium, an input module, a reading module, and a writing module. The recording medium includes a write area and an escape area. The write area includes track groups. Each of the track groups is a unit for writing data and includes tracks. The input module receives a write command for data. The reading module reads data stored in the escape area and data from a first track group of the track groups. The writing module writes data received for the write command to the escape area, and writes merged data obtained by merging the data read from the escape area and the data read from the first track group to each track of a second track group of the track groups by using a shingle recording technique in which adjacent tracks are partly overlapped with each other.

9 Claims, 7 Drawing Sheets

RECORDING MEDIUM CONTROLLER AND METHOD THEREOF

CROSS-REFERENCE TO RELATED APPLICATIONS

This application is based upon and claims the benefit of priority from Japanese Patent Application No. 2010-124898, filed May 31, 2010, the entire contents of which are incorporated herein by reference.

FIELD

Embodiments described herein relate generally to a recording medium controller configured to write data to a recording medium using the shingle recording technique, and to a method thereof.

BACKGROUND

A hard disk drive (HDD) comprising a magnetic disk has conventionally been used. The recent trend is to further increase the capacity of a hard disk. In order to increase the recording density for increasing the capacity, there has been disclosed a technique in which the track density is decreased by reducing track widths.

There has also been disclosed another technique for increasing the track density. In this technique, the track widths are decreased to an extent that data is written to adjacent tracks in a partly overlapping manner. Such a recording technique is often referred to as shingle recording. However, when this technique is applied, the data stored in the adjacent track in a partly overlapping manner is lost. Therefore, data writing must be performed per unit track group composed of a plurality of tracks (for example, see Japanese Patent Application Publication (KOKAI) No. 2006-338731).

However, employing the technique disclosed in Japanese Patent Application Publication (KOKAI) No. 2006-338731 takes long time to write data because the writing must be performed per unit track group.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a recording medium controller comprises a recording medium, an input module, a reading module, and a writing module. The recording medium comprises a write area and an escape area temporarily storing data therein. The write area comprises track groups. Each of the track groups is a unit for writing data and comprises a plurality of tracks. The input module is configured to receive a write command for data. The reading module is configured to read data stored in the escape area and data from a first track group of the track groups. The writing module is configured to write data received for the write command to the escape area, and to write merged data obtained by merging the data read from the escape area and the data read from the first track group to each track comprised in a second track group of the track groups by using a shingle recording technique in which adjacent tracks are partly overlapped with each other.

An exemplary embodiment of a magnetic disk device using a recording medium controller and a recording medium controlling method is described below in greater detail with reference to the drawings. However, the embodiment described hereunder is not intended to limit the scope of the present invention in any way.

Figure 1:
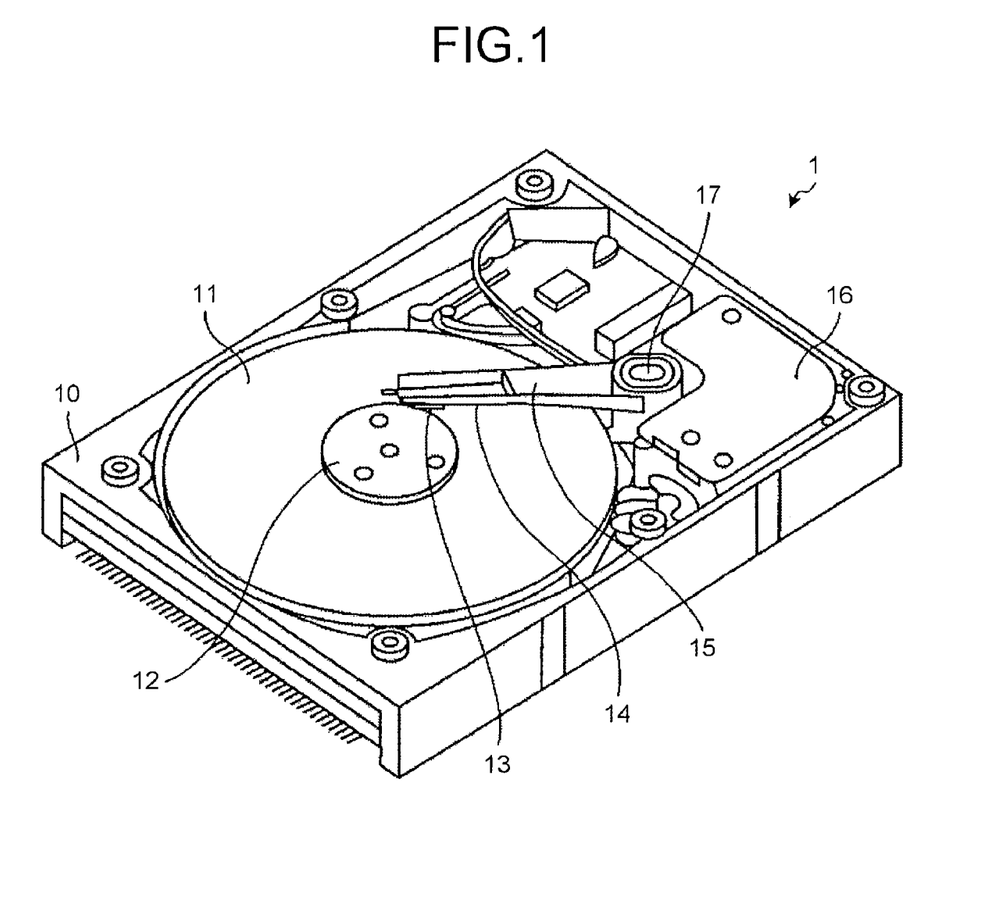
FIG. 1 is an exemplary perspective view of a magnetic disk device according to an embodiment.

A mechanical structure of the magnetic disk device according to the embodiment will now be explained with reference to FIG. 1. FIG. 1 is a perspective view of the magnetic disk device according to the embodiment.

A magnetic disk device 1 illustrated in FIG. 1 comprises a magnetic disk 11, a spindle motor 12 configured to rotate the magnetic disk 11, a head slider 13 in which a magnetic head (not illustrated in FIG. 1) is incorporated, a suspension 14, and an actuator arm 15 in a housing 10 as main mechanical components thereof in the same manner as in a known hard disk drive. The magnetic disk device 1 also comprises a head suspension assembly configured to support the head slider 13, and a voice coil motor (VCM) 16 that is an actuator for the head suspension assembly.

The spindle motor 12 rotates the magnetic disk 11. A magnetic head having a recording head and a reproducing head (neither of which is illustrated in FIG. 1) is incorporated in the head slider 13. The actuator arm 15 is mounted on a pivot 17 in a rotational manner, and the suspension 14 is attached to one end of the actuator arm 15. The suspension 14 supports the head slider 13 flexibly via a gimbal disposed thereon. The VCM 16 is located at the other end of the actuator arm 15. The VCM 16 rotates the actuator arm 15 about the pivot 17 to bring the floating magnetic head at a certain position in the radius direction of the magnetic disk 11.

Figure 2:
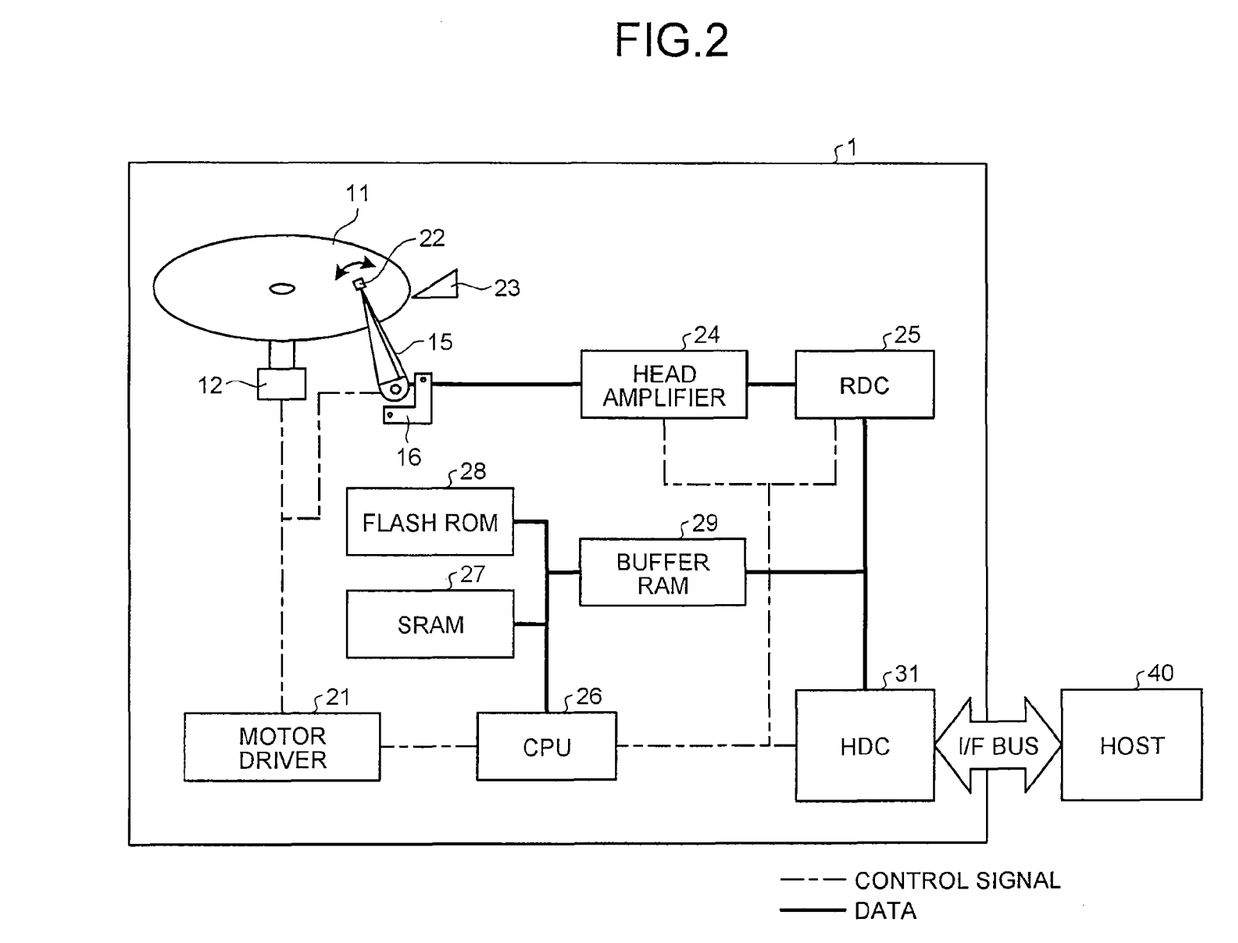
FIG. 2 is an exemplary block diagram of an electrical hardware configuration of the magnetic disk device in the embodiment.

An electrical hardware configuration of the magnetic disk device 1 according to the embodiment will now be explained with reference to FIG. 2. FIG. 2 is a block diagram of the electrical hardware configuration of the magnetic disk device 1 according to the embodiment.

In FIG. 2, the spindle motor 12 (FIG. 1) rotates the magnetic disk 11 about a rotation axis at a predetermined rotation speed. A motor driver 21 drives rotation of the spindle motor 12.

A magnetic head 22 uses the recording head and the reproducing head comprised therein to read and to write data from and to the magnetic disk 11. As mentioned earlier, the magnetic head 22 is placed at the distal end of the actuator arm 15, and moved in the radius direction on the magnetic disk 11 by the VCM 16 driven by the motor driver 21. When the magnetic disk 11 is not under the rotation, for example, the magnetic head 22 is evacuated onto a ramp 23.

A head amplifier 24 amplifies a signal read using the magnetic head 22 from the magnetic disk 11, and outputs the signal to a read/write channel (RDC) 25. The head amplifier 24 also amplifies a signal received from the RDC 25 for writing data to the magnetic disk 11, and supplies the signal to the magnetic head 22.

The RDC 25 performs a code modulation on data received from a HDC 31 to be explained later and to be written to the magnetic disk 11, and supplies the data to the head amplifier 24. The RDC 25 also performs a code demodulation on a signal read from the magnetic disk 11 and received via the head amplifier 29, and outputs the signal to the HDC 31 as digital data.

A central processing unit (CPU) 26 is connected to a static random access memory (SRAM) 27 that is a working memory, a flash read-only memory (ROM) 28 that is a non-volatile memory, and a buffer random access memory (RAM) 29 used as a temporary memory. The CPU 26 controls the entire magnetic disk device 1 in accordance with firmware pre-stored in the flash ROM 28 and the magnetic disk 11. (This firmware comprises initial firmware and controlling firmware used for regular operations. The controlling firmware further comprises a magnetic disk controlling program, which is to be explained later. The initial firmware, which is executed initially upon booting, is stored in the flash ROM 28. The controlling firmware, which is used for regular operations, is stored in the magnetic disk 11. The controlling firmware is read once from the magnetic disk 11 to the buffer RAM 29 following a control performed by the initial firmware, and then stored in the SRAM 27.

The hard disk controller (HDC) 31 controls data transmissions and receptions performed between the magnetic disk device 1 and a host computer (hereinafter, simply referred to as "host") 40 via an interface (I/F) bus, controls the buffer RAM 29, and performs error corrections on data. The buffer RAM 29 is used as a cache for data transmitted to and received from the host computer 40. The buffer RAM 29 is also used for temporarily storing therein data read from or to be written to the magnetic disk 11, and the controlling firmware read from the magnetic disk 11, for example.

Figure 3:
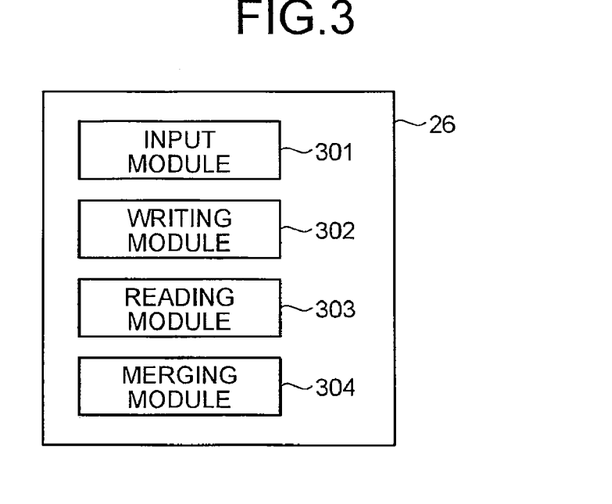
FIG. 3 is an exemplary block diagram of a software configuration realized by a central processing unit (CPU) of the magnetic disk device executing a computer program, in the embodiment.

FIG. 3 is a block diagram of a software configuration realized by the CPU 26 comprised in the magnetic disk device 1. Here, the CPU 26 executes the magnetic disk controlling program to realize the software configuration. As illustrated in FIG. 3, the CPU 26 comprised in the magnetic disk device 1 starts the magnetic disk controlling program comprised in the controlling firmware stored in the flash ROM 28 to realize an input module 301, a writing module 302, a reading module 303, and a merging module 304.

The input module 301 receives data write commands or data read commands from the host 40 connected to the magnetic disk device 1. Examples of the data write commands comprise a write command for data having a size storable in a sector comprised in a single track of the magnetic disk 11, or sequential write commands for data having a larger size.

The writing module 302 controls writing data to the magnetic disk 11. When the writing module 302 according to the embodiment performs write controls, the writing module 302 needs to write data to a track having a width smaller than the main pole width of the magnetic head 22.

Therefore, the writing module 302 according to the embodiment performs writes using the shingle recording technique. The shingle recording technique is a technique for writing data in an overlapping manner while scanning an extremely small amount along the track direction by the recording head. Because the track width of the magnetic disk 11 used in the shingle recording technique is smaller than the main pole width of the recording head, data written to adjacent tracks partly overlap each other. Because the smaller track width can be used when the shingle recording technique is adopted, the density of a medium can be increased.

In the shingle recording technique, data in adjacent tracks is lost because the data in adjacent tracks are written in partly overlapping manner. Therefore, even when particular data in a certain track is to be updated, the particular data alone cannot be updated, but whole data in a number of tracks needs to be updated. In this embodiment, such unit of tracks is referred to as a track group. Here, an unused area is provided between the track groups. Thus, when data is written to one of the track groups, data in other one of the track groups adjacent the one of the track groups is protected from being overwritten.

Figure 4:
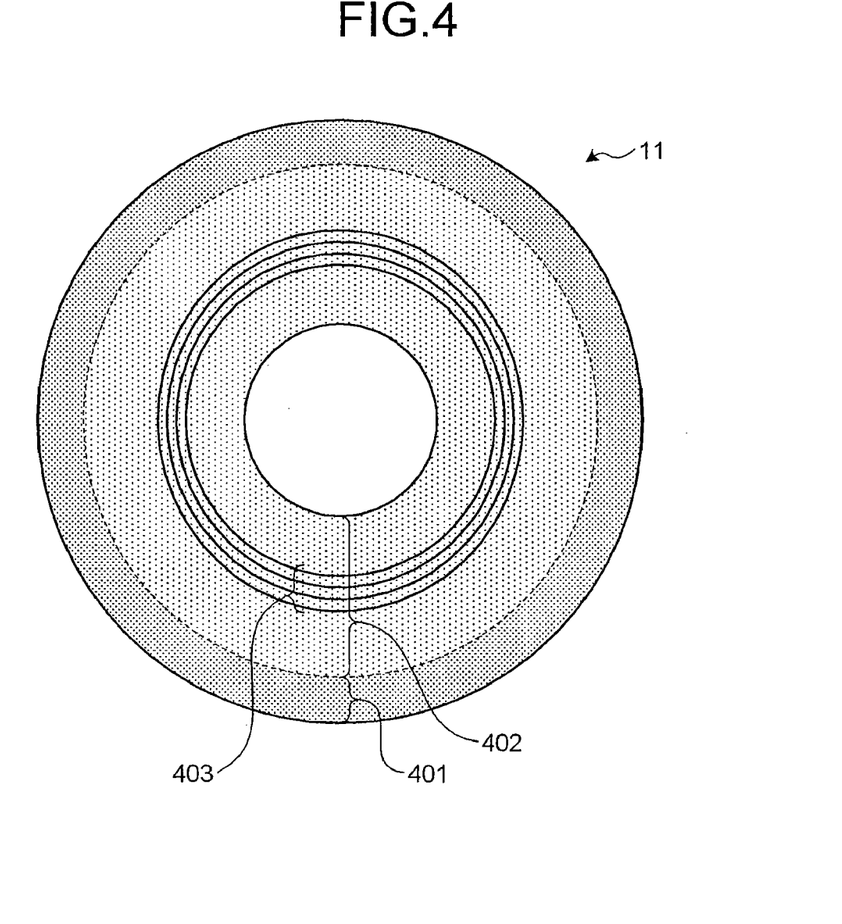
FIG. 4 is an exemplary schematic diagram of recording areas on a magnetic disk to which data is written by a writing module in the embodiment.

FIG. 4 is a schematic diagram of a recording area on the magnetic disk 11 to which data is written by the writing module 302. As illustrated in FIG. 4, the magnetic disk 11 comprises a write area 402 used as a regular data recording area and an escape area 401 used as temporary storage area for the data.

The write area 402 comprises a plurality of track groups (a track group 403, for example). As mentioned earlier, each of the track groups comprises a plurality of tracks, each having a width smaller than the main pole width of the head performing the writes. The number of tracks comprised in the track groups is not limited, but the number of tracks in the following explanation is assumed to be 100.

The write area 402 comprises not only track groups assigned with logical addresses, but also those not assigned with logical addresses. In the embodiment, a track group not assigned with a logical address is referred to as a spare track group. The number of spare track groups allocated in the write area 402 is not limited, and a plurality of the spare track groups may be allocated. In the magnetic disk 11 according to the embodiment, the tracks comprised in the magnetic disk 11 are concentrically divided by head/zone. A number of sectors per track are different for the head/zone. More specifically, the number of sectors per track is larger in one of the heads/zones located nearer to the outer circumference. In other words, the capacity of the tracks is different for the heads/zones. Thus, in the magnetic disk 11 according to the embodiment, a spare track group is provided for each head/zone. In this manner, because a spare track is provided for each of the heads/zones, the entire data written in a single track can be written to a single spare track, even if the capacity of the tracks is different for each of the heads/zones.

The escape area 401 temporarily stores therein data to be written to the write area 402. Assuming that a single platter of the magnetic disk 11 has a capacity ranging from 500 gigabytes to one terabytes, the escape area 401 of several gigabytes is provided, for example.

The reason why the escape area 401 is comprised in the magnetic disk 11 will now be explained. To rewrite data using the shingle recording technique, the data in the entire track group needs to be rewritten. Therefore, much longer time is required than a conventional data rewriting technique. Thus, in the magnetic disk device 1 according to the embodiment, the temporary escape area 401 is provided. Then, at the time when the writing module 302 writes data in accordance with a write command, the data is temporarily written to the escape area 401 instead of the track group in the write area 402. In this manner, the time required for the writing is reduced.

The escape area 401 according to the embodiment is located on the outer side of the magnetic disk 11. In this manner, the writing and the reading speeds can be improved.

The escape area 401 may be a group of tracks each with a small track width so that data is written using the shingle recording technique. Alternatively, the escape area 401 may be a group of tracks each with a conventional track width so that data can be written without data of adjacent tracks being overlapped.

The reading module 303 reads at least one of the data stored in the escape area 401 and the data stored in the write area 402 when the input module 301 receives a read command or when the data written in the magnetic disk 11 is to be updated.

Figure 5:
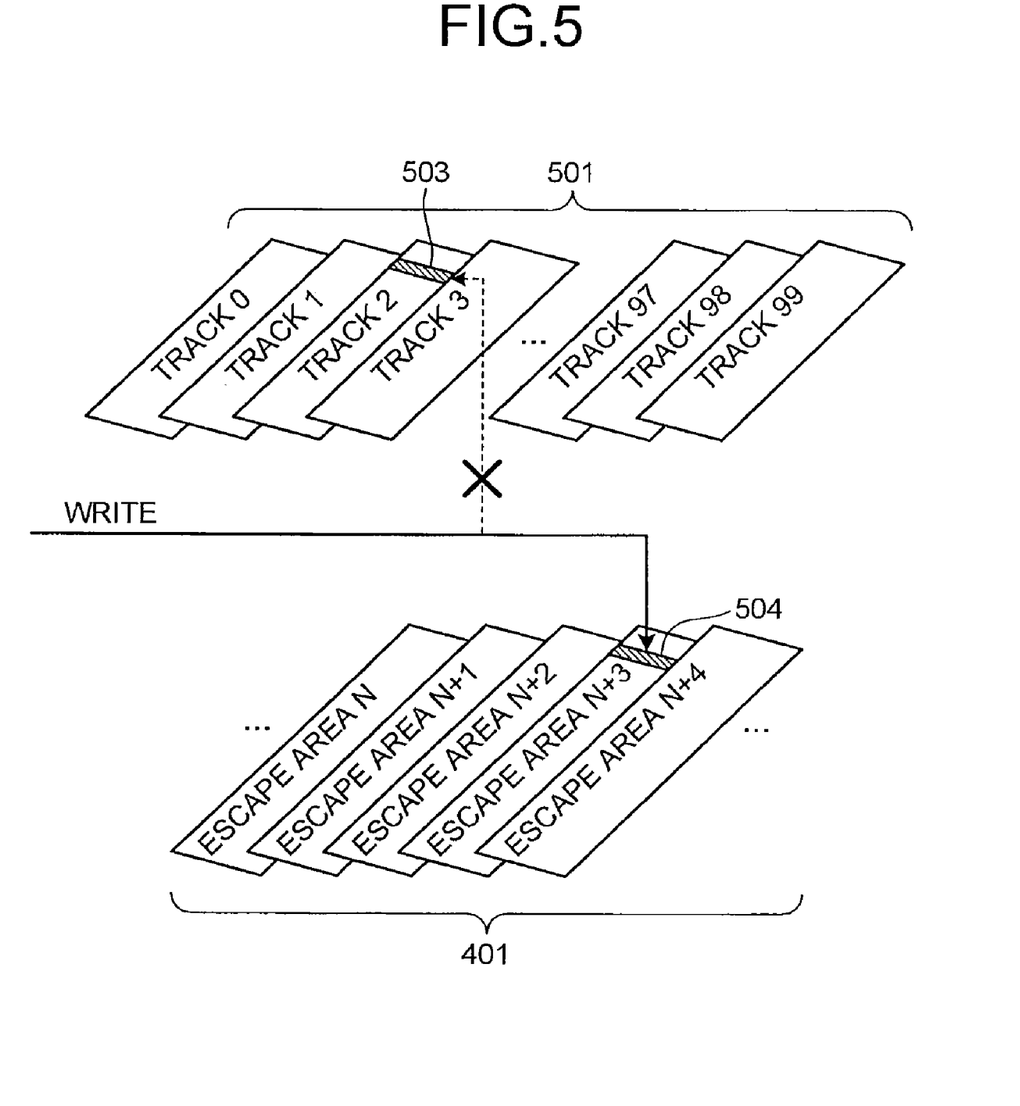
FIG. 5 is an exemplary schematic diagram illustrating a process of writing data to an escape area by the writing module when an input module receives a command for updating data, in the embodiment.

FIG. 5 is a schematic diagram illustrating a process of writing data to the escape area 401 performed by the writing module 302 when the input module 301 receives a command for updating data. In the example illustrated in FIG. 5, it is assumed that the input module 301 receives a write command for data to be written to a sector 503 in a track 2 comprised in a track group 501. If the data at the sector 503 is updated using the shingle recording method, the entire track group 501 must be updated. This process will require long time.

Therefore, in the embodiment, when the input module 301 receives an update command for a part of a track or a sector (e.g., the sector 503) of a track group to which data from the host 40 is already stored, the writing module 302 writes data corresponding to the update command to a track or a sector (e.g., sector 504) of the escape area 401.

After the writing, the writing module 302 reassigns a logical address that has previously been assigned to the track or the sector to be updated (e.g., the sector 503) to the track or the sector in the escape area 401 (e.g., sector 504). This process ends the writing performed for the update command received by the input module 301.

When such process is performed continuously, the capacity of the escape area 401 will be overused. Thus, to avoid overusing the capacity of the escape area 401, in the magnetic disk device 1 according to the embodiment, the data stored in the escape area 401 is written to the write area 402. This writing process is performed during an idle time excluding a time during which the input module 301 is performing processes in response to the read or write commands.

In the writing process performed during the idle time, the data stored in the escape area 401 and the data stored in the track group that is being updated are merged. In other words, in the magnetic disk device 1 according to the embodiment, because the merging is performed during the idle time, the merging does not interrupt executions of processes performed for read or write commands issued by the host 40, and the executions of such processes are not delayed.

During the idle time, the merging module 304 merges the data read from the escape area 401 and the data read from the track group in the write area 402, each of which is read by the reading module 303, by using a buffer (not illustrated).

The writing module 302 then writes the data merged by the merging module 304 to each of the tracks comprised in a spare track group, which is arranged separately from the track group read by the reading module 303.

Figure 6:
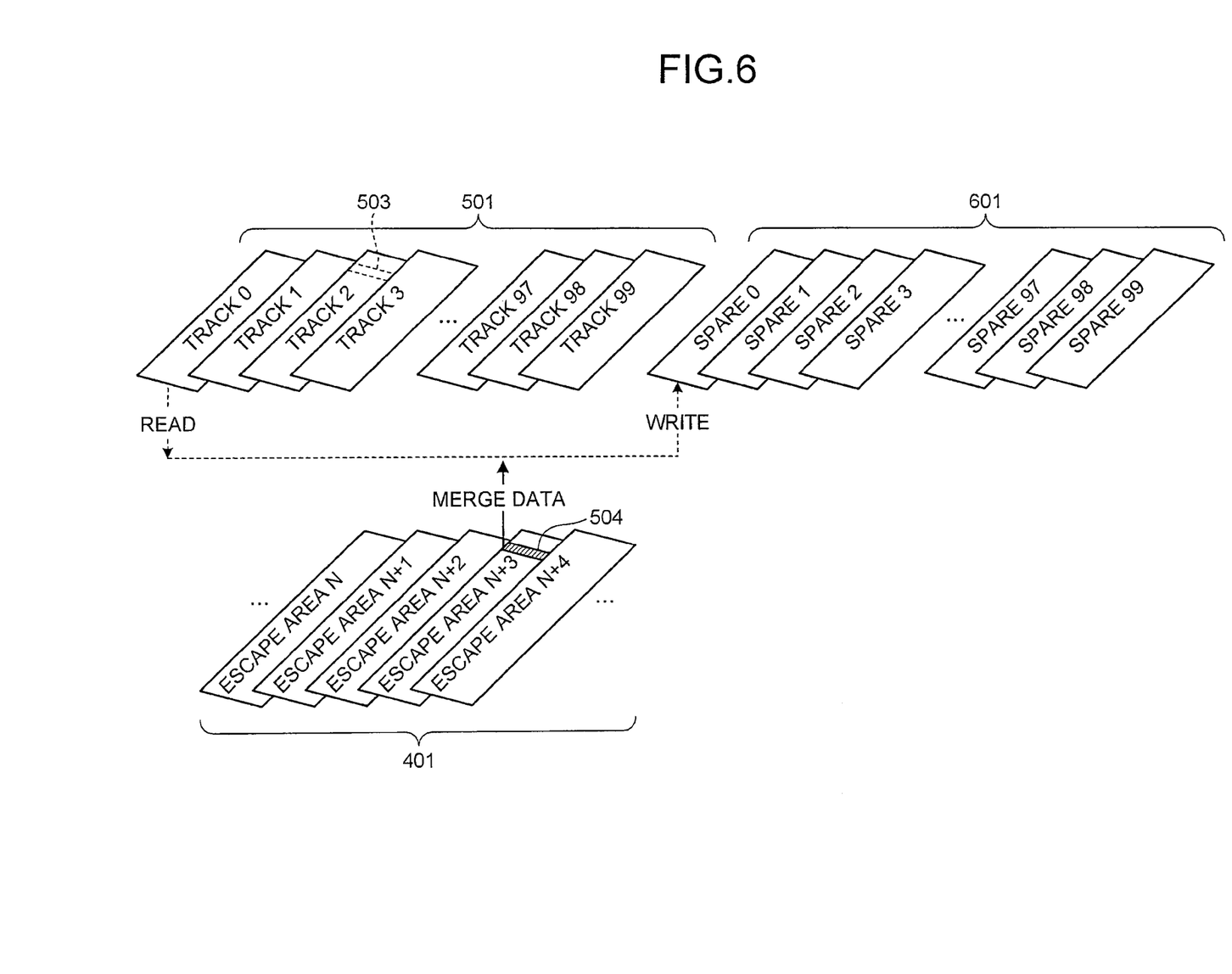
FIG. 6 is an exemplary schematic diagram illustrating a process in the magnetic disk drive, and in which data stored in the escape area is written to a track group comprised in a write area, in the embodiment.

FIG. 6 is a schematic diagram illustrating a process of writing the data stored in the escape area 401 to the track group in the write area 402, performed by the magnetic disk device 1 according to the embodiment. FIG. 6 illustrates an example where the merging module 304 merges the data stored in the sector 504 in the escape area 401 by the process of FIG. 5 and the data stored in the track group 501, and where the writing module 302 writes the merged data to the spare track group.

As illustrated in FIG. 6, the writing module 302 writes the data read by the reading module 303 from the track group 501 to a spare track group 601. During this process, the reading module 303 also reads the data from the sector 504 comprised in the escape area 401. The merging module 304 then merges the data read from the sector 504 comprised in the escape area 401 and the data read by the reading module 303 from a track 2 comprised in the track group 501. The writing module 302 then writes the merged data to the spare track group 601.

After completing writing the data of the track group, the writing module 302 reassigns the logical address assigned to the track group 501 which is the target of the updating to the spare track group 601, and deletes the logical address of the original track group 501. Consequently, the track group 501 is set as a new spare track group.

In the process illustrated in FIG. 6, the writing control is performed on the spare track group 601 only, and any data in the original track group 501 is not updated. Therefore, the data in the track group 501 is always protected, and no data is lost even if the power shuts down unexpectedly. Furthermore, no recovering process is particularly required even if the power shuts down during the process illustrated in FIG. 6. Assuming that a recovering process is performed, the data stored in the spare track group 601 can simply be discarded to allow the writing module 302 to start writing data from the beginning of the spare track group 601.

In the magnetic disk device 1 according to the embodiment, when a write is performed using the shingle recording technique, the escape area 401 in the magnetic disk 11 is used. However, because the capacity of the escape area 401 is limited, it is necessary not to overuse the capacity.

If all of the write commands received by the input module 301 are for data of relatively small blocks, all of the data can be stored in the escape area 401 without overusing the escape area 401. However, if the input module 301 receives sequential write commands, which are often observed in copying a large file or the like, the escape area 401 will be overused. If the amount of data stored in the escape area 401 increases, a number of the writing of the data of the tracks by the shingle recording technique increases. Accordingly, the performance will deteriorate significantly.

Hence, in the magnetic disk device 1 according to the embodiment, when the input module 301 receives sequential write commands, the writing module 302 begins to write data for the write commands to the escape area 401. Then, at the timing when a logical address specified as a target address for the sequential writes changes from the address of the first track group for writing data to the address of the next track group, the writing module 302 starts writing the subsequent data directly to the spare track group thereafter. When the writing module 302 completes writing data to the spare track group, the writing module 302 assigns a logical address to the spare track group, and sets the track group originally being updated as new spare track group. If the write commands still continue, the writing module 302 further continues writing data to the spare track group that is newly made available. Sequential write commands can be handled by repeating this process.

During the idle time and after completing writing data for the sequential write commands according to the process explained above, the magnetic disk device 1 merges the data written to the escape area 401 and the data stored in the track groups originally being updated. The merging process is the same as the process illustrated in FIG. 6. In this manner, even if the sequential write commands are received, the capacity of the escape area 401 can be prevented from being overused by allowing data to be written directly to the spare track group during the process.

Furthermore, the magnetic disk device 1 explained in the first embodiment can support a multi-threaded write. In other words, because the magnetic disk 11 has a spare track group for each of the heads/zones, by allowing a multi-threaded write to use the respective spare tracks for the different heads/zones, the writing module 302 can write data to a plurality of track groups simultaneously.

Even if the targets of the multi-threaded write commands are in the same heads/zones, such command can be handled by providing spare track groups at positions that maximize the track capacity in the magnetic disk 11 and making such spare track groups available for any heads/zones.

Figure 7:
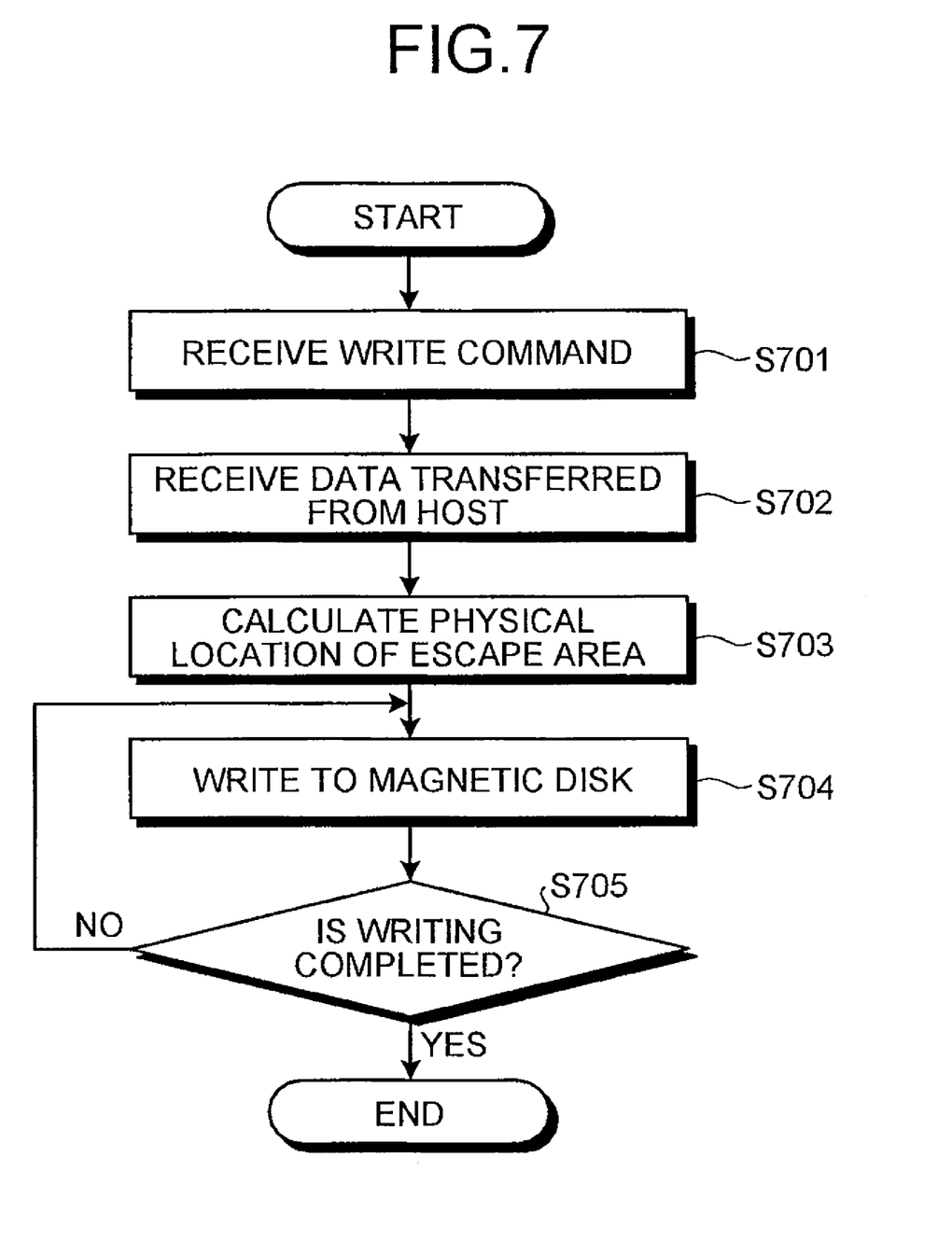
FIG. 7 is an exemplary flowchart of a writing process of the magnetic disk device performed in response to a write command, in the embodiment.

The writing in response to the write command issued in the magnetic disk device 1 according to the embodiment will now be explained. FIG. 7 is a flowchart of the process performed in the magnetic disk device 1 according to the embodiment.

First, the input module 301 receives a write command issued by the host 40 (S701). The input module 301 then receives the data to be written, transferred from the host 40 (S702). It is assumed herein that the data has a size storable in a track or a sector comprised in a track group, and the data does not rewrite the entire track group.

Upon receipt of the write command for data having such size, the writing module 302 calculates a physical location in the escape area for storing the data (S703). The physical location in the escape area may be at any location, and may be calculated sequentially based on the write request. In this manner, the writing module 302 calculates the location in the escape area having no relationship with the location for writing the data specified in the write command.

The writing module 302 then writes the data to the calculated physical location on the magnetic disk 11 (S704). The writing module 302 then determines if the write is completed (S705). If the writing module 302 determines that the write is not completed (No at S705), the writing module 302 continues writing the data at S704.

By contrast, when the writing module 302 determines that the write is completed (Yes at S705), the writing module 302 assigns a logical address, which is previously assigned to a target location in the track groups specified in the write command, to the escape area in which the data is stored. Then, the writing module 302 deletes the logical address of the target location to prevent such an address from being referred to, and ends the process.

Figure 8:
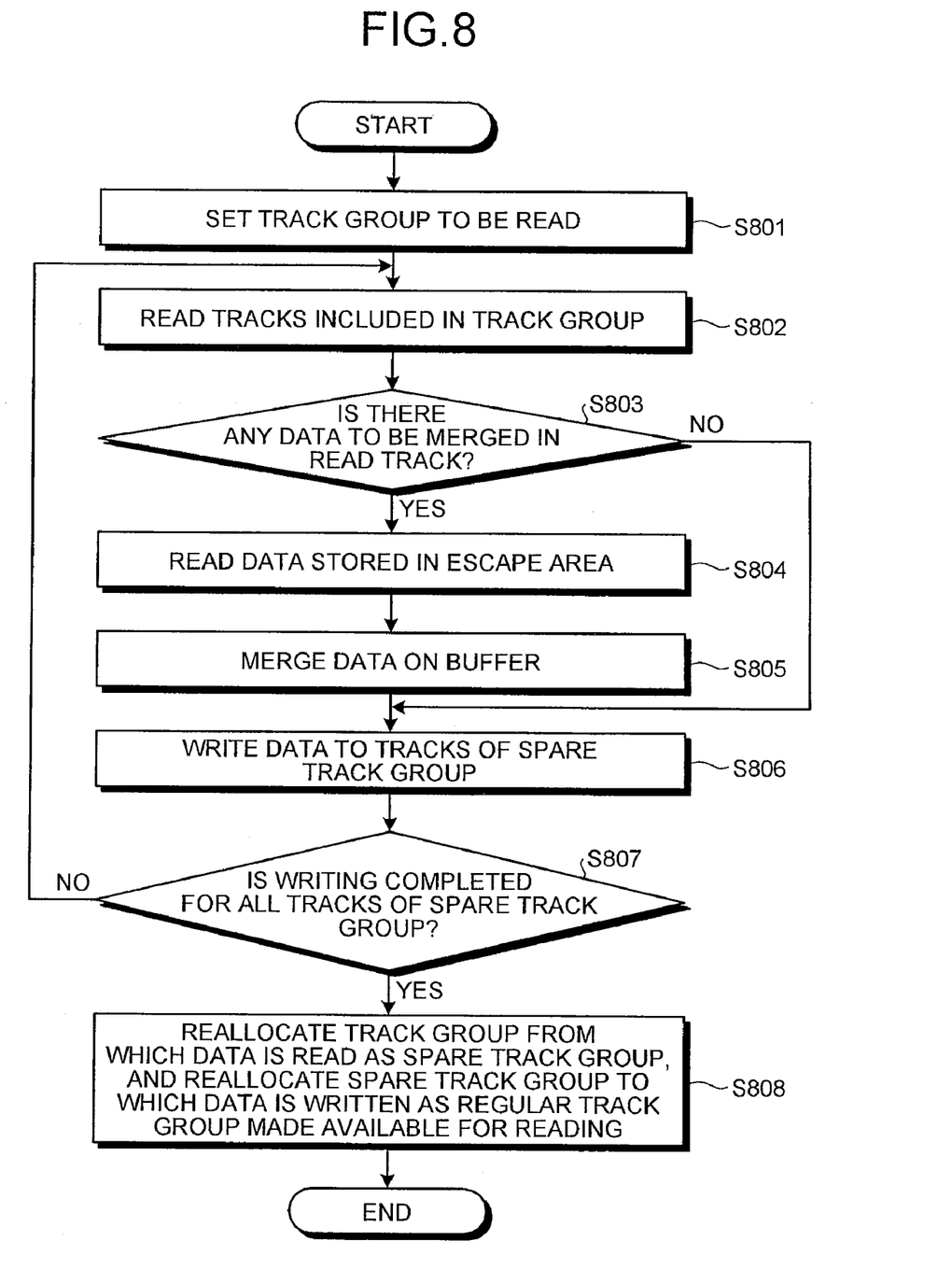
FIG. 8 is an exemplary flowchart of a process of the magnetic disk device, and in which data stored in the escape area is written to the track group, in the embodiment.

A process of writing data stored in the escape area 401 to a track group in the magnetic disk device 1 according to the embodiment will now be explained. FIG. 8 is a flowchart of the process in the magnetic disk device 1 according to the embodiment. It is assumed that the process illustrated in the flowchart of FIG. 8 is performed in the idle time during which the input module 301 receives no read/write command. In this manner, the reading/writing is prevented from being delayed by the process illustrated in FIG. 8.

First, the reading module 303 sets a track group for reading data (S801). The track group for reading data is determined based on whether any data in the escape area is available for being merged with the data stored in such a track group, for example.

The reading module 303 then reads the data stored in the tracks comprised in the set track group (S802). The reading module 303 then determines if there is any data that should be merged with the data read from the tracks based on the set logical address (S803).

If the reading module 303 determines that there is no data that should be merged (No at S803), S806 is performed without any intervening process.

By contrast, if the reading module 303 determines that there is some data that should be merged (Yes at S803), the reading module 303 reads the data temporarily stored in the escape area so that such data can be merged with the data read from the tracks at S802 (S804).

The merging module 304 then merges the data read at S804 and the data read from the tracks at S802 (S805).

The writing module 302 then writes the data to the tracks in the spare track group (S806). The writing module 302 writes the merged data when there is some data that should be merged, and writes the data read at S802 when there is no data that should be merged.

The writing module 302 then determines if the write of the data is completed in all of the tracks comprised in the spare track group (S807). If the writing module 302 determines that the write is not completed (No at S807), the reading module 303 starts reading the data from the tracks again at S802.

By contrast, if the writing module 302 determines that the write of the data is completed in all of the tracks comprised in the spare track group (Yes at S807), the writing module 302 changes the logical addresses so that the track group that has been read is reallocated as a new spare track group and the spare track group to which data has been written is reallocated as a regular track group that makes the data available for reading, and ends the process (S808). At this time, the writing module 302 also changes the logical address assigned to the escape area.

By the process described above, the data temporarily stored in the escape area can be comprised in the regular track groups.

In the magnetic disk device 1 according to the embodiment, the data is read and written by means of the configurations described above. In this manner, even when data is recorded to the magnetic disk 11 using the shingle recording technique, the time required for rewriting the data can be reduced. Furthermore, when the data is to be copied from a track group to a spare track group, because only the spare track group is rewritten, a data loss can be avoided even when the power shuts down unexpectedly. As described above, the technique adopted in the magnetic disk device 1 is suitable for actual production environment.

In the magnetic disk device 1 according to the embodiment, when a write command, especially a write command for data in a small unit, e.g., sectors, is received, the data is once written to the escape area 401, then written to the track groups as described above. Therefore, in the magnetic disk device 1, the write can be completed in a shorter time than the time required for writing data in the entire track group. Thus, the number of tracks comprised in a track group can be increased compared with a conventional example.

In the magnetic disk device 1 according to the embodiment, when data is written using the shingle recording technique, the spare track group is used. The data in a track group and the data in the escape area are merged, and the merged data is written to the spare track group. In this manner, the data is protected against a loss caused by the data being overwritten, and against an unexpected power shutdown.

In the magnetic disk device 1 according to the embodiment, during sequential writes, the data is written to the spare track group instead of the escape area, whereby the escape area is protected against overuse and performance degradation is prevented.

Furthermore, in the magnetic disk device 1 according to the embodiment, the spare track group may be provided in plurality to allow a multi-threaded write to be handled. In addition, by providing a common spare track group to each of the heads/zones of the magnetic disk 11, versatility can be improved.

The magnetic disk controlling program executed by the CPU 26 in the magnetic disk device 1 according to the embodiment is provided in a manner pre-installed in the flash ROM 28.

Alternatively, the magnetic disk controlling program executed by the CPU 26 in the magnetic disk device 1 according to the embodiment may be provided in a manner recorded in a computer-readable recording medium such as a compact disk read-only memory (CD-ROM), a flexible disk (FD), a compact disk recordable (CD-R), and a digital versatile disk (DVD) as a file in an installable or an executable format.

Furthermore, the magnetic disk controlling program executed by the CPU 26 in the magnetic disk device 1 according to the embodiment may be provided in a manner stored in a computer connected to a network such as the Internet to be made available for downloads via the network. The magnetic disk controlling program executed by the CPU 26 in the magnetic disk device 1 according to the embodiment may also be provided or distributed over a network such as the Internet.

The magnetic disk controlling program executed by the CPU 26 in the magnetic disk device 1 according to the embodiment has a modular structure comprising each of the modules explained above (the input module, the writing module, the reading module, and the merging module). As the actual hardware, the CPU 26 reads the magnetic disk controlling program from the flash ROM 28 and executes the same. Accordingly, each of the modules is loaded to the main memory, and the input module, the writing module, the reading module, and the merging module are provided on the main memory.

In other words, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A recording medium controller configured to use a recording technique of collectively rewriting all tracks included in a track group, which comprises a plurality of tracks and is a unit for writing data, by causing adjacent tracks to be partially overlapped with each other, comprising:

a recording medium comprising a write area having the plurality of the track groups and an escape area temporarily storing data therein;

an input module configured to receive an update command for data recorded in the write area;

a reading module configured to read data from a first track group, which includes the data to be updated by the update command, of the track groups; and a writing module configured to write the data to be updated by the update command to the escape area after receiving the update command, and to rewrite merged data obtained by merging the data read from the escape area and the data read from the first track group to each track comprised in a second track group of the track groups by using the recording technique.

2. The recording medium controller of claim 1, wherein, if the update command is received, the writing module is configured to rewrite the merged data to the each track comprised in the second track group during an idle time excluding a time during which a process in response to a read command or a write command is performed.

3. The recording medium controller of claim 2, wherein
the input module is configured to receive an update command for data with a size storable in a sector of a track of the tracks, and
the writing module is configured to write the data with the size to be updated by the update command to the escape area.

4. The recording medium controller of claims 2, wherein
the second track group is a spare area allocated as a spare, any logical address not being assigned to the spare area until the writing module rewrites the merged data; and
the writing module is configured to assign, after rewriting the merged data to the each track of the second track group, a logical address to the second track group, to delete a logical address of the first track group, and to set the first track group as a new spare area allocated as a spare.

5. The recording medium controller of claim 1, wherein
the input module is configured to receive an update command for data with a size storable in a sector of a track of the tracks, and
the writing module is configured to write the data with the size to be updated by the update command to the escape area.

6. The recording medium controller of claims 5, wherein
the second track group is a spare area allocated as a spare, any logical address not being assigned to the spare area until the writing module rewrites the merged data; and
the writing module is configured to assign, after rewriting the merged data to the each track of the second track group, a logical address to the second track group, to delete a logical address of the first track group, and to set the first track group as a new spare area allocated as a spare.

7. The recording medium controller of claim 1, wherein
the second track group is a spare area allocated as a spare, any logical address not being assigned to the spare area until the writing module rewrites the merged data; and
the writing module is configured to assign, after rewriting the merged data to the each track of the second track group, a logical address to the second track group, to delete a logical address of the first track group, and to set the first track group as a new spare area allocated as a spare.

8. A recording medium controlling method executed by a recording medium controller configured to use a recording technique of collectively rewriting all tracks included in a track group, which comprises a plurality of tracks and is a unit for writing data, by causing adjacent tracks to be partially overlapped with each other, wherein, the recording medium controller comprises a recording medium comprising a write area having the plurality of the track groups and an escape area temporarily storing data therein, and the method comprises:

receiving an update command for data recorded in the write area;

reading data from a first track group, which includes the data to be updated by the update command, of the track groups; and writing the data to be updated by the update command to the escape area after receiving the update command, and rewriting merged data obtained by merging the data read from the escape area and the data read from the first track group to each track comprised in a second track group of the track groups by using the recording technique.

9. The recording medium controlling method of claim 8, wherein, if the update command is received, the writing is configured to rewrite the merged data to the each track comprised in the second track group during an idle time excluding a time during which a process in response to a read command or a write command is performed.

* * * * *